(12) United States Patent
Han

(10) Patent No.: US 10,923,522 B2
(45) Date of Patent: Feb. 16, 2021

(54) BACKSIDE ILLUMINATED IMAGE SENSOR AND METHOD OF MANUFACTURING THE SAME

(71) Applicant: DB HITEK CO., LTD., Seoul (KR)

(72) Inventor: Chang Hun Han, Icheon-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/565,937

(22) Filed: Sep. 10, 2019

(65) Prior Publication Data
US 2020/0091209 A1 Mar. 19, 2020

(30) Foreign Application Priority Data
Sep. 13, 2018 (KR) .................. 10-2018-0109621

(51) Int. Cl.
*H01L 27/146* (2006.01)
(52) U.S. Cl.
CPC .... *H01L 27/1464* (2013.01); *H01L 27/14621* (2013.01); *H01L 27/14629* (2013.01)
(58) Field of Classification Search
CPC .................................. H01L 27/1464
See application file for complete search history.

(56) References Cited

U.S. PATENT DOCUMENTS

| 10,217,787 | B2 | 2/2019 | Han | |
| 10,777,600 | B2* | 9/2020 | Takahashi | H01L 31/02325 |
| 2013/0112849 | A1* | 5/2013 | Shimotsusa | H01L 27/14645 |
| | | | | 250/206 |
| 2015/0340400 | A1* | 11/2015 | Takemoto | H01L 24/05 |
| | | | | 257/448 |

* cited by examiner

*Primary Examiner* — Yu-Hsi D Sun
(74) *Attorney, Agent, or Firm* — Patterson Thuente Pedersen, P.A.

(57) ABSTRACT

A backside illuminated image sensor includes pixel regions disposed in a substrate, an insulating layer disposed on a frontside surface of the substrate, a bonding pad disposed on a frontside surface of the insulating layer, and an anti-reflective layer disposed on a backside surface of the substrate. The substrate has a first opening for partially exposing a backside surface of the insulating layer, and the insulating layer has a third opening for partially exposing a backside surface of the bonding pad. The anti-reflective layer comprises a first portion disposed on an inner side surface of the first opening and a second portion disposed on a portion of the backside surface of the insulating layer exposed by the first opening and having a second opening connecting the first opening with the third opening, and a first spacer is disposed on inner side surfaces of the second opening and the third opening.

20 Claims, 15 Drawing Sheets

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2018-0109621, filed on Sep. 13, 2018, and all the benefits accruing therefrom under 35 U.S.C. § 119, the contents of which are incorporated by reference in their entirety.

TECHNICAL FIELD

The instant application relates generally to semiconductor device manufacturing and processes thereof. These processes result in novel devices for use in backside illuminated image sensors.

BACKGROUND

The present disclosure relates to a backside illuminated image sensor and a method of manufacturing the same.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The backside illuminated image sensor may have improved light-receiving efficiency in comparison with the frontside illuminated image sensor. The backside illuminated image sensor may include pixel regions in a substrate, transistors formed on a frontside surface of the substrate, an insulating layer formed on the transistors, bonding pads on the insulating layer, an anti-reflective layer formed on a backside surface of the substrate, a light-blocking pattern formed on the anti-reflective layer, a planarization layer formed on the light-blocking pattern, a color filter layer formed on the planarization layer, and micro lens array formed on the color filter layer.

The bonding pads may be exposed by openings formed through the substrate and the insulating layer. Wires may be bonded on the bonding pads through the opening or solder bumps may be formed on backside surfaces of the bonding pads. Further, a protective layer may be formed to protect inner surfaces of the openings and to electrically isolate the substrate from the bonding pads.

The openings may be formed after forming the anti-reflective layer or the planarization layer, and the protective layer may be formed on the inner surfaces of the openings and the anti-reflective layer or planarization layer. As a result, the distance between the pixel regions and the micro lens array may be increased by the protective layer, and the sensitivity and crosstalk of the backside illuminated image sensor may thus be deteriorated.

SUMMARY

The present disclosure provides a backside illuminated image sensor having an improved structure and a method of manufacturing the backside illuminated image sensor.

In accordance with an aspect of the present disclosure, a backside illuminated image sensor may include pixel regions disposed in a substrate, an insulating layer disposed on a frontside surface of the substrate, a bonding pad disposed on a frontside surface of the insulating layer, and an anti-reflective layer disposed on a backside surface of the substrate, wherein the substrate has a first opening for partially exposing a backside surface of the insulating layer, the insulating layer has a third opening for partially exposing a backside surface of the bonding pad, the anti-reflective layer comprises a first portion disposed on an inner side surface of the first opening and a second portion disposed on a portion of the backside surface of the insulating layer exposed by the first opening and having a second opening connecting the first opening with the third opening, and a first spacer is disposed on inner side surfaces of the second opening and the third opening.

In accordance with some exemplary embodiments of the present disclosure, a second spacer may be disposed on the first portion of the anti-reflective layer.

In accordance with some exemplary embodiments of the present disclosure, the second opening may have the same width as the third opening, and the first spacer may be made of the same material as the second spacer.

In accordance with some exemplary embodiments of the present disclosure, the backside illuminated image sensor may further include a second bonding pad disposed on a portion of the backside surface of the bonding pad exposed by the third opening.

In accordance with some exemplary embodiments of the present disclosure, the backside illuminated image sensor may further include a light-blocking pattern disposed on the anti-reflective layer and having fourth openings corresponding to the pixel regions.

In accordance with some exemplary embodiments of the present disclosure, the second bonding pad may be made of the same material as the light-blocking pattern.

In accordance with some exemplary embodiments of the present disclosure, the backside illuminated image sensor may further include a third bonding pad disposed on the second bonding pad.

In accordance with some exemplary embodiments of the present disclosure, the anti-reflective layer may include a metal oxide layer disposed on the backside surface of the substrate, a silicon oxide layer disposed on the metal oxide layer, and a silicon nitride layer disposed on the silicon oxide layer.

In accordance with some exemplary embodiments of the present disclosure, each of the pixel regions may include a charge accumulation region disposed in the substrate, and a frontside pinning layer disposed between the frontside surface of the substrate and the charge accumulation region.

In accordance with some exemplary embodiments of the present disclosure, the each of the pixel regions may further include a backside pinning layer disposed between the backside surface of the substrate and the charge accumulation region.

In accordance with another aspect of the present disclosure, a method of manufacturing a backside illuminated image sensor may include forming pixel regions in a substrate, forming an insulating layer on a frontside surface of the substrate, forming a bonding pad on a frontside surface of the insulating layer, partially removing the substrate to form a first opening exposing a portion of a backside surface of the insulating layer, forming anti-reflective layer on a backside surface of the substrate, an inner side surface of the first opening and the portion of the backside surface of the insulating layer exposed by the first opening, partially removing the anti-reflective layer and the insulating layer to form a second opening and a third opening exposing a portion of a backside surface of the bonding pad, and forming a first spacer on inner side surfaces of the second opening and the third opening.

In accordance with some exemplary embodiments of the present disclosure, the method may further include forming a second spacer on a portion of the anti-reflective layer formed on the inner side surface of the first opening.

In accordance with some exemplary embodiments of the present disclosure, the first spacer may be made of the same material as the second spacer.

In accordance with some exemplary embodiments of the present disclosure, the method may further include forming a first metal layer on the anti-reflective layer, the first and second spacers, and the portion of the backside surface of the bonding pad exposed by the third opening, forming a second metal layer on the first metal layer, patterning the second metal layer to form a third bonding pad, and patterning the first metal layer to from a second bonding pad between the bonding pad and the third bonding pad.

In accordance with some exemplary embodiments of the present disclosure, the method may further include forming a second bonding pad on the portion of the backside surface of the bonding pad exposed by the third opening.

In accordance with some exemplary embodiments of the present disclosure, the method may further include forming a light-blocking pattern having fourth openings corresponding to the pixel regions on the anti-reflective layer.

In accordance with some exemplary embodiments of the present disclosure, the second bonding pad may be made of the same material as the light-blocking pattern and simultaneously formed with the light-blocking pattern.

In accordance with some exemplary embodiments of the present disclosure, forming the anti-reflective layer may include forming a metal oxide layer on the backside surface of the substrate, the inner side surface of the first opening and the portion of the backside surface of the insulating layer exposed by the first opening, forming a silicon oxide layer on the metal oxide layer, and forming a silicon nitride layer of the silicon oxide layer.

In accordance with some exemplary embodiments of the present disclosure, forming the pixel regions may include forming charge accumulation regions in the substrate, and forming frontside pinning layers between the frontside surface of the substrate and the charge accumulation regions.

In accordance with some exemplary embodiments of the present disclosure, forming the pixel regions may further include forming backside pinning layers between the backside surface of the substrate and the charge accumulation regions.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
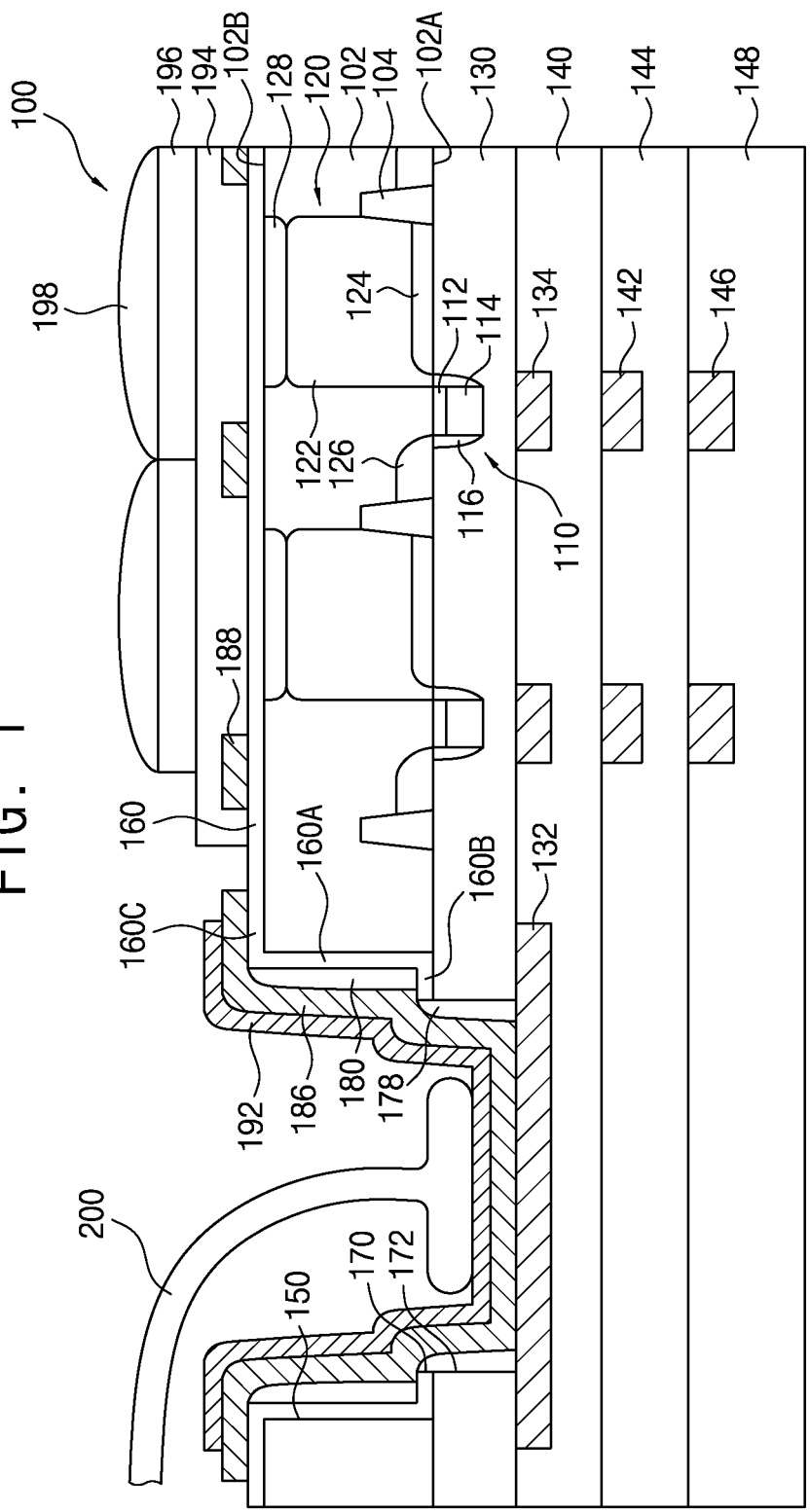
FIG. 1 is a cross-sectional view illustrating a backside illuminated image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, embodiments of the present invention are described in more detail with reference to the accompanying drawings. However, the present invention is not limited to the embodiments described below and is implemented in various other forms. Embodiments below are not provided to fully complete the description of the present invention but rather are provided to convey one aspect of the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a cross-sectional view illustrating a backside illuminated image sensor in accordance with an embodiment of the present disclosure.

Referring to FIG. 1, a backside illuminated image sensor 100, in accordance with an embodiment of the present disclosure, may include pixel regions 120 disposed in a substrate 102, an insulating layer 130 disposed on a frontside surface 102A of the substrate 102, a bonding pad 132 disposed on a frontside surface of the insulating layer 130, and an anti-reflective layer 160 disposed on a backside surface 102B of the substrate 102. The substrate 102 may have a first opening 150 for partially exposing a backside surface of the bonding pad 132, and the anti-reflective layer 160 and the insulating layer 130 may have a corresponding second opening 170 and a third opening 172 for partially exposing the backside surface of the bonding pad 132, respectively.

The anti-reflective layer 160 may extend along an inner side surface of the first opening 150 and may be used to protect the substrate 102 and to electrically isolate the substrate 102 from a wire (e.g., wire) 200 or a solder bump (not shown) electrically connected with the bonding pad 132. For example, the anti-reflective layer 160 may include a first portion 160A disposed on an inner side surface of the first opening 150 and a second portion 160B disposed on a portion of the backside surface of the insulating layer 130 exposed by the first opening 150 and having the second opening 170. That is, the second opening 170 may be formed through the second portion 160B of the anti-reflective layer 160. Further, the first opening 150 may have a width wider than that of the second opening 170, and the third opening 172 may have the same width as the second opening 170.

The backside illuminated image sensor 100 may include a second bonding pad 186 disposed on the portion of the backside surface of the bonding pad 132 exposed by the first, second and third openings 150, 170 and 172. Further, the backside illuminated image sensor 100 may include a light-blocking pattern 188 disposed on the anti-reflective layer 160 and having fourth openings 190 (refer to FIG. 15) corresponding to the pixel regions 120. Particularly, the second bonding pad 186 may be made of the same material as the light-blocking pattern 188. For example, the second bonding pad 186 and the light-blocking pattern 188 may be made of a metallic material, e.g., tungsten.

The backside illuminated image sensor 100 may include a third bonding pad 192 disposed on the second bonding pad 186. For example, the third bonding pad 192 may be made of copper or aluminum. Further, though not shown in FIG. 1, a titanium layer and a titanium nitride layer serving as a diffusion barrier layer and an adhesive layer may be formed between the bonding pad 132 and the second bonding pad 186.

A planarization layer 194 may be disposed on the anti-reflective layer 160 and the light-blocking pattern 188, and a color filter layer 196 and a micro lens array 198 may be disposed on the planarization layer 194. For example, the planarization layer 194 may be made of silicon oxide or photoresist material.

Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on the frontside surface 102A of the substrate 102, a gate electrode 114 disposed on the gate insulating layer 112, and gate spacers 116 disposed on side surfaces of the gate electrode 114. Further, though not shown in FIG. 1, the backside illuminated image sensor 100 may include reset transistors, source follower transistors, and select transistors electrically connected with the floating diffusion regions 126, in ways that will be understood to those of ordinary skill in the art.

If the backside illuminated image sensor 100 is a 3T (or fewer than three transistors) layout, the transfer gate structures 110 may be used as reset gate structures and the floating diffusion regions 126 may be used as active regions for connecting the charge accumulation regions 122 with reset circuitries.

The pixel regions 120 may include a frontside pinning layer 124 disposed between the frontside surface 102A of the substrate 102 and the charge accumulation region 122, respectively. Further, the pixel regions 120 may include a backside pinning layer 128 disposed between the backside surface 102B of the substrate 102 and the charge accumulation region 122, respectively. The frontside and backside pinning layers 124 and 128 may have the first conductivity type. For example, p-type impurity diffusion regions may be used as the frontside and backside pinning layers 124 and 128.

A first wiring layer 134 may be disposed on the insulating layer 130 and may be electrically connected with the pixel regions 120. The first wiring layer 134 may be made of the same material as the bonding pad 132.

Further, a second insulating layer 140 may be disposed on a frontside surface of the insulating layer 130, the bonding pad 132 and the first wiring layer 134, and a second wiring layer 142 may be disposed on the second insulating layer 140. A third insulating layer 144 may be disposed on the second insulating layer 140 and the second wiring layer 142, and a third wiring layer 146 may be disposed on the third insulating layer 144. A passivation layer 148 may be disposed on the third insulating layer 144 and the third wiring layer 146.

Figure 2:
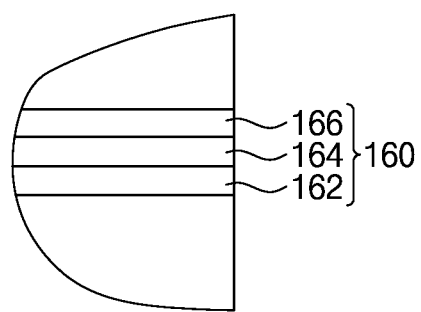
FIG. 2 is an enlarged partial cross-sectional view illustrating an anti-reflective layer as shown in FIG. 1.

FIG. 2 is an enlarged cross-sectional view illustrating an anti-reflective layer as shown in FIG. 1.

Referring to FIG. 2, the anti-reflective layer 160 may include a metal oxide layer 162 disposed on the backside surface 102B of the substrate 102, a silicon oxide layer 164 disposed on the metal oxide layer 162, and a silicon nitride layer 166 disposed on the silicon oxide layer 164.

The metal oxide layer 162 may function as a fixed charge layer. For example, the metal oxide layer 162 may function as a negative fixed charge layer and include hafnium oxide ($HfO_2$), hafnium oxynitride (HfON), aluminum oxide ($Al_2O_3$), aluminum oxynitride (AlON), hafnium aluminum oxide (HfAlO) or hafnium aluminum oxynitride (HfAlON). In such case, negative charges of the negative fixed charge layer may form a negatively charged shallow minority carrier rich region, i.e., a hole accumulation region, in a backside surface portion of the substrate 102, and the hole accumulation region may improve the function of the backside pinning layers 128 (FIG. 1).

Referring again to FIG. 1, when the charge accumulation region 122 has the first conductivity type, that is, an n-type substrate is used as the substrate 102 and the charge accumulation region 122 include p-type impurities, the metal oxide layer 162 may function as a positive fixed charge layer and include zirconium oxide ($ZrO_2$), hafnium silicon oxide ($HfSiO_2$), hafnium silicon oxynitride (HfSiON) or silicon nitride ($Si_3N_4$). In such case, the positive fixed charge layer may form an electron accumulation region in a backside surface portion of the substrate 102.

Referring still to FIG. 1, the substrate 102 may be protected by the anti-reflective layer 160. In particular, the substrate 102 may be electrically isolated from the bonding pad 132 by the anti-reflective layer 160.

in accordance with an embodiment of the disclosure, a first spacer 178 may be disposed on inner side surfaces of the second opening 170 and the third opening 172, and a second spacer 180 may be disposed on a first portion 160A of the anti-reflective layer 160 formed on the inner side surface of the first opening 150. For example, the first and second spacers 178 and 180 may be made of an insulating material, e.g., silicon oxide.

Particularly, as shown in FIG. 1, the second bonding pad 186 may be disposed on the portion of the backside surface of the bonding pad 132 exposed by the third opening 172, the first and second spacers 178 and 180, and a third portion 160C of the anti-reflective layer 160 disposed on the backside surface 102B of the substrate 102 and surrounding the first opening 150. The third bonding pad 192 may be disposed on the second bonding pad 186, and a wire 200 may be bonded on the third bonding pad 192. Alternatively, a solder bump (not shown) may be formed on the third bonding pad 192. At this time, the first spacer 178 may be used to electrically isolate the metal oxide 162 of the anti-reflective layer 160 from the bonding pad 132.

FIGS. 3 to 15 are cross-sectional views illustrating a method of manufacturing the backside illuminated image sensor as shown in FIG. 1.

Figure 3:
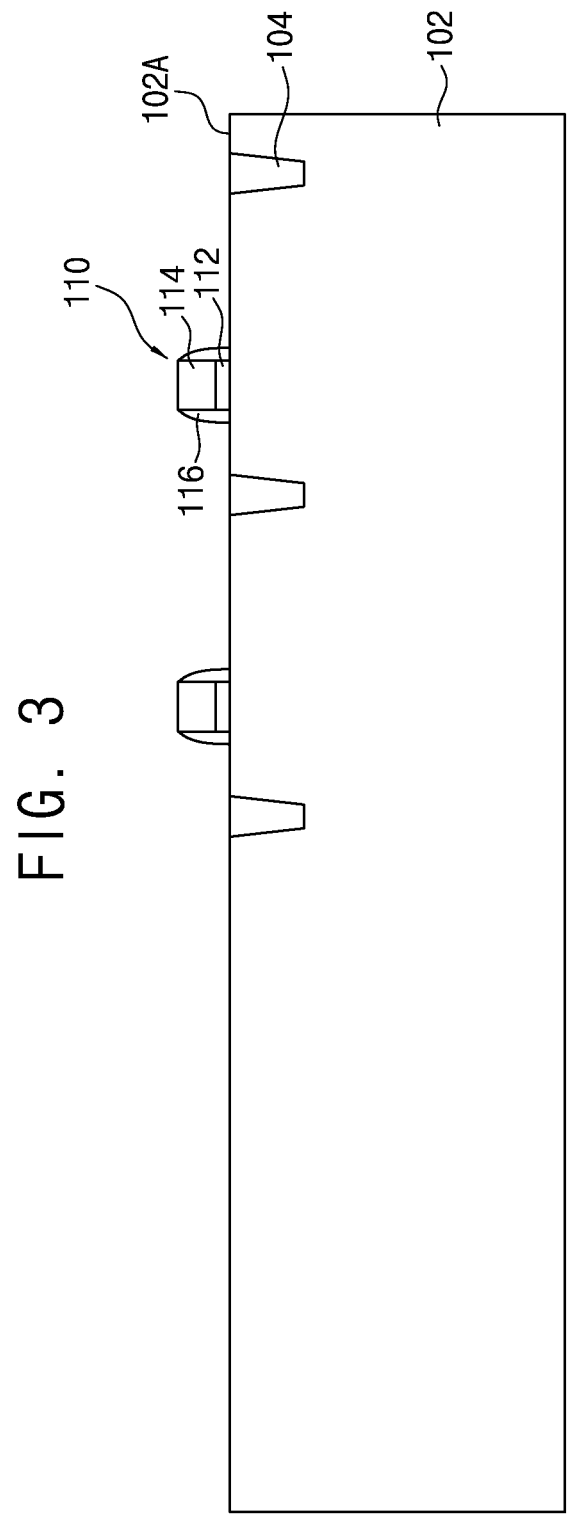
FIGS. 3 to 15 are cross-sectional views illustrating a method of manufacturing the backside illuminated image sensor as shown in FIG. 1.

Referring to FIG. 3, device isolation regions 104 may be formed in frontside surface portions of a substrate 102 (i.e., along 102A) to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of silicon oxide and may be formed by a shallow trench isolation (STI) process.

After forming the device isolation regions 104, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102.

Figure 4:
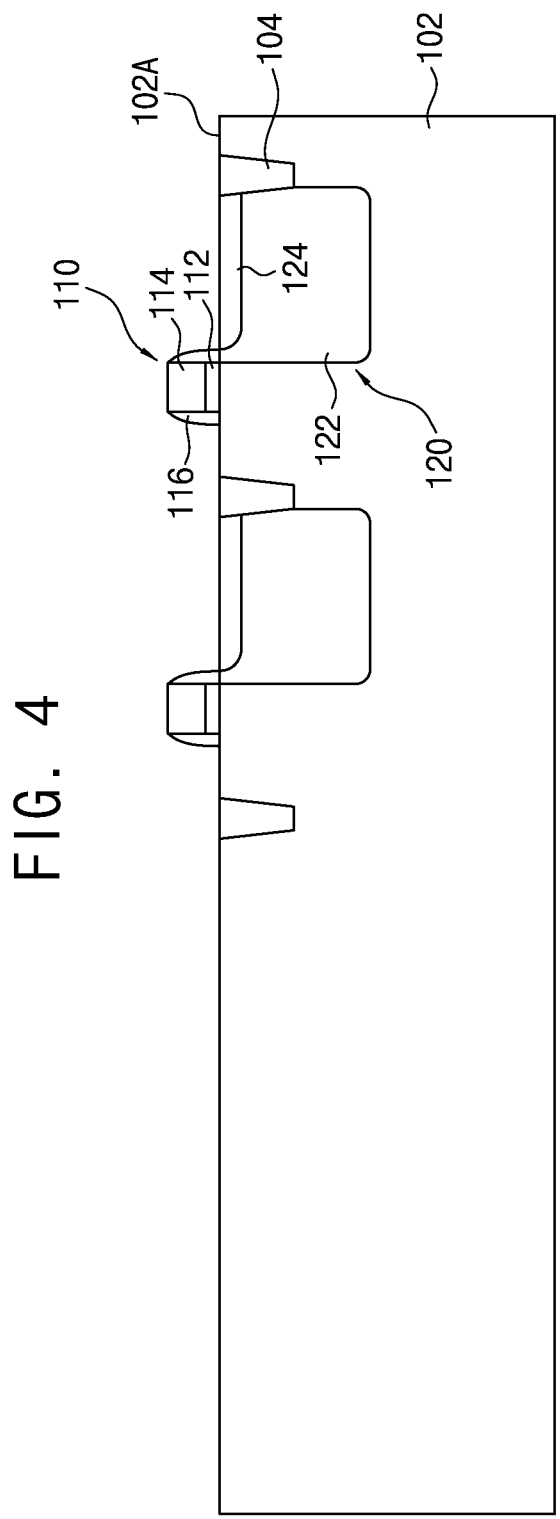

Referring to FIG. 4, charge accumulation regions 122 used as pixel regions 120 may be formed in the substrate 102. In detail, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Then, frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 5:
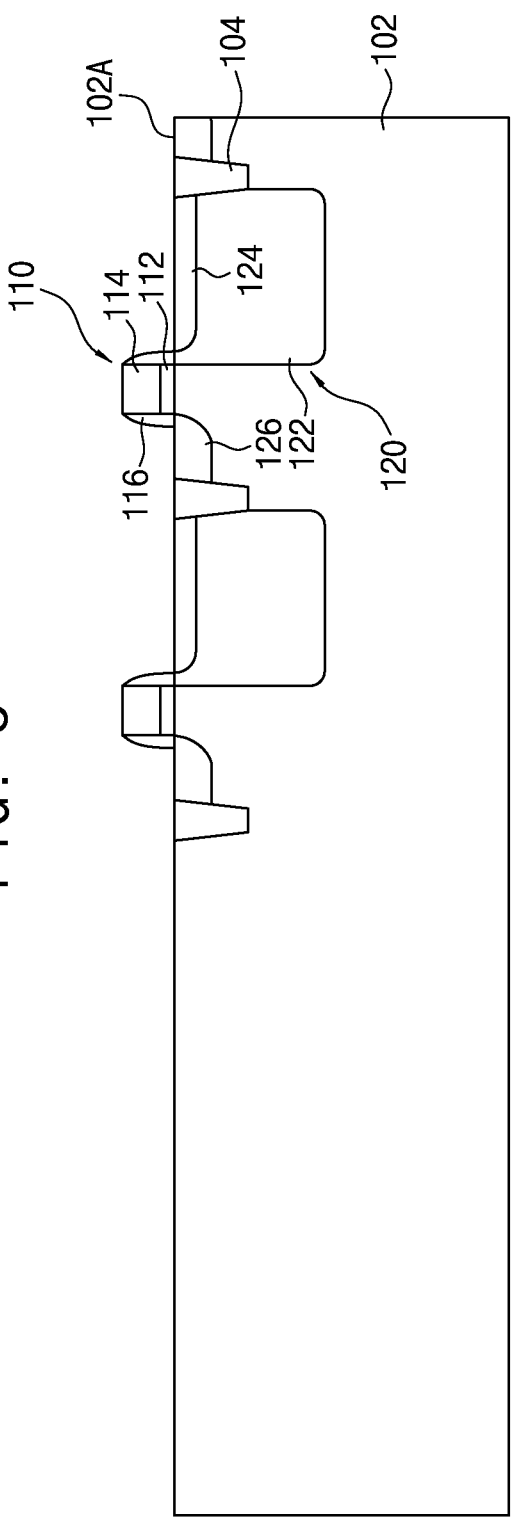

Referring to FIG. 5, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. At this time, the transfer gate structures 110 may be arranged on channel regions between the charge accumulation regions 122 and the floating diffusion regions 126.

Figure 6:
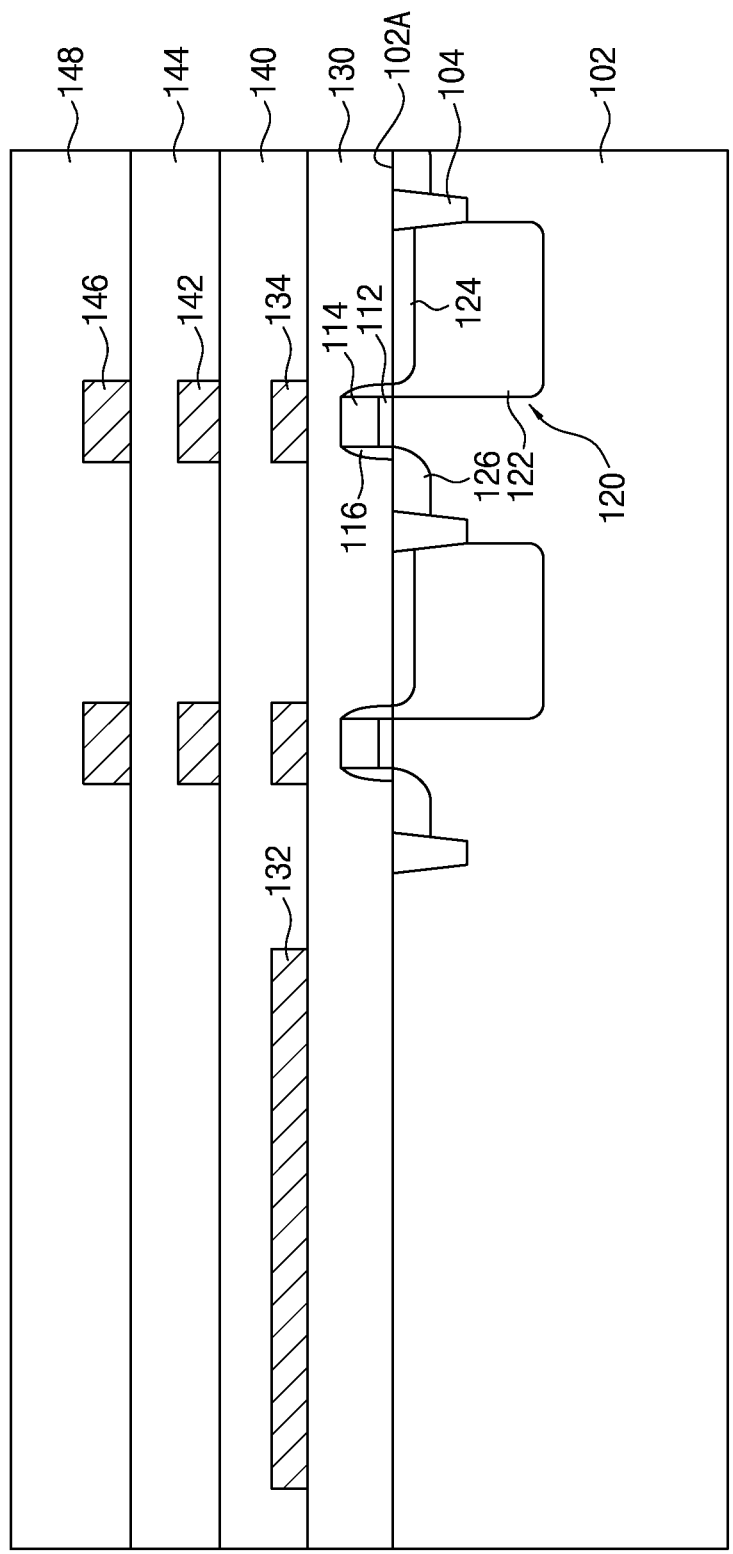

Referring to FIG. 6, an insulating layer 130 may be formed on the frontside surface 102A of the substrate 102, and a bonding pad 132 and a first wiring layer 134 may be formed on the insulating layer 130. The insulating layer 130 may be made of an insulating material such as silicon oxide, and the bonding pad 132 and the first wiring layer 134 may be made of a metallic material such as copper or aluminum. For example, after forming the insulating layer 130, a metal layer (not shown) may be formed on the insulating layer 130, and the bonding pad 132 and the first wiring layer 134 may then be formed by patterning the metal layer.

A second insulating layer 140 may be formed on the insulating layer 130, the bonding pad 132 and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. A passivation layer 148 may be formed on the third insulating layer 144 and the third wiring layer 146. The first, second and third wiring layers 134, 142 and 146 may be electrically connected with the pixel regions 120, and the bonding pad 132 may be electrically connected with the first, second and third wiring layers 134, 142 and 146.

Figure 7:
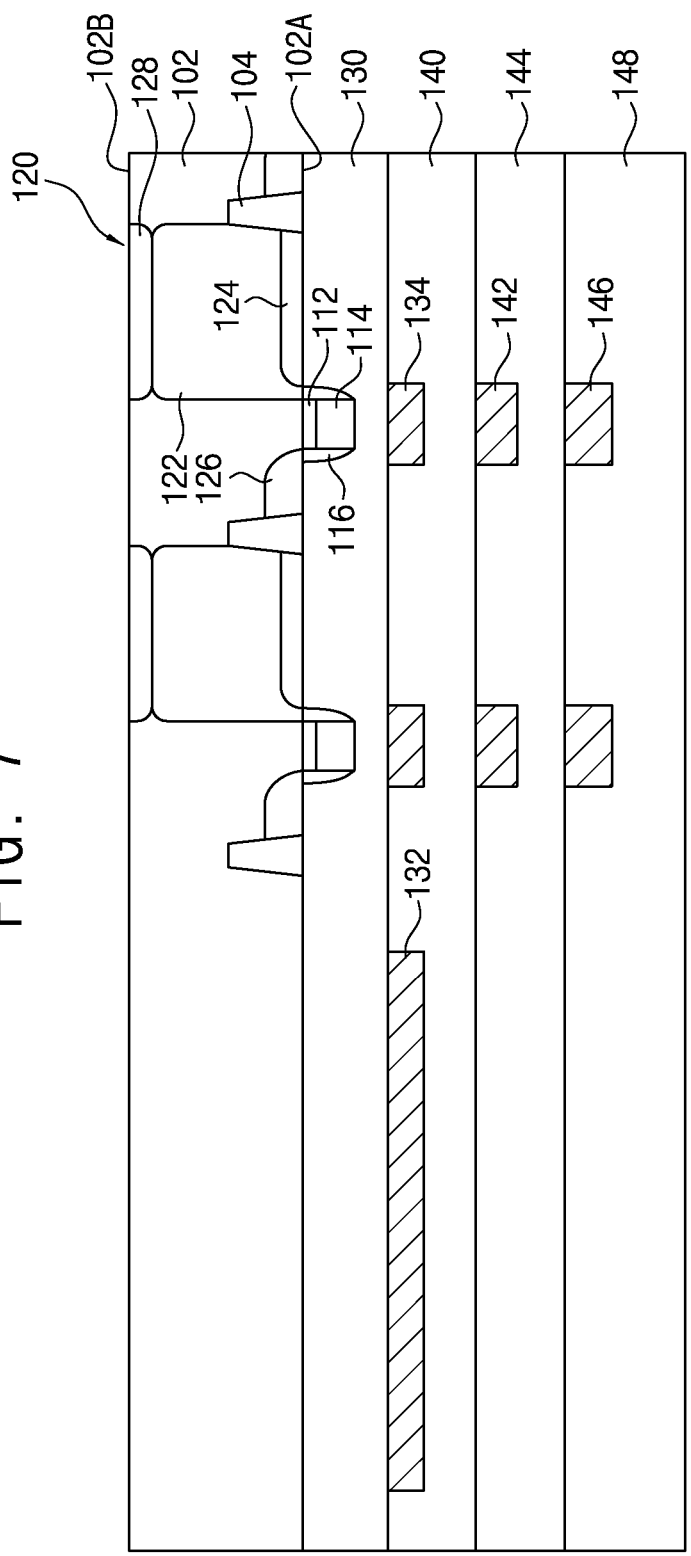

Referring to FIG. 7, a back-grinding process or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

Alternatively, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

The substrate 102 thus includes a bulk silicon substrate, and a p-type epitaxial layer is formed on that bulk silicon substrate. The charge accumulation regions 122 and the frontside and backside pinning layers 124 and 128 may be formed in the p-type epitaxial layer, and at least a portion of the bulk silicon substrate may be removed by the back-grinding process.

Figure 8:
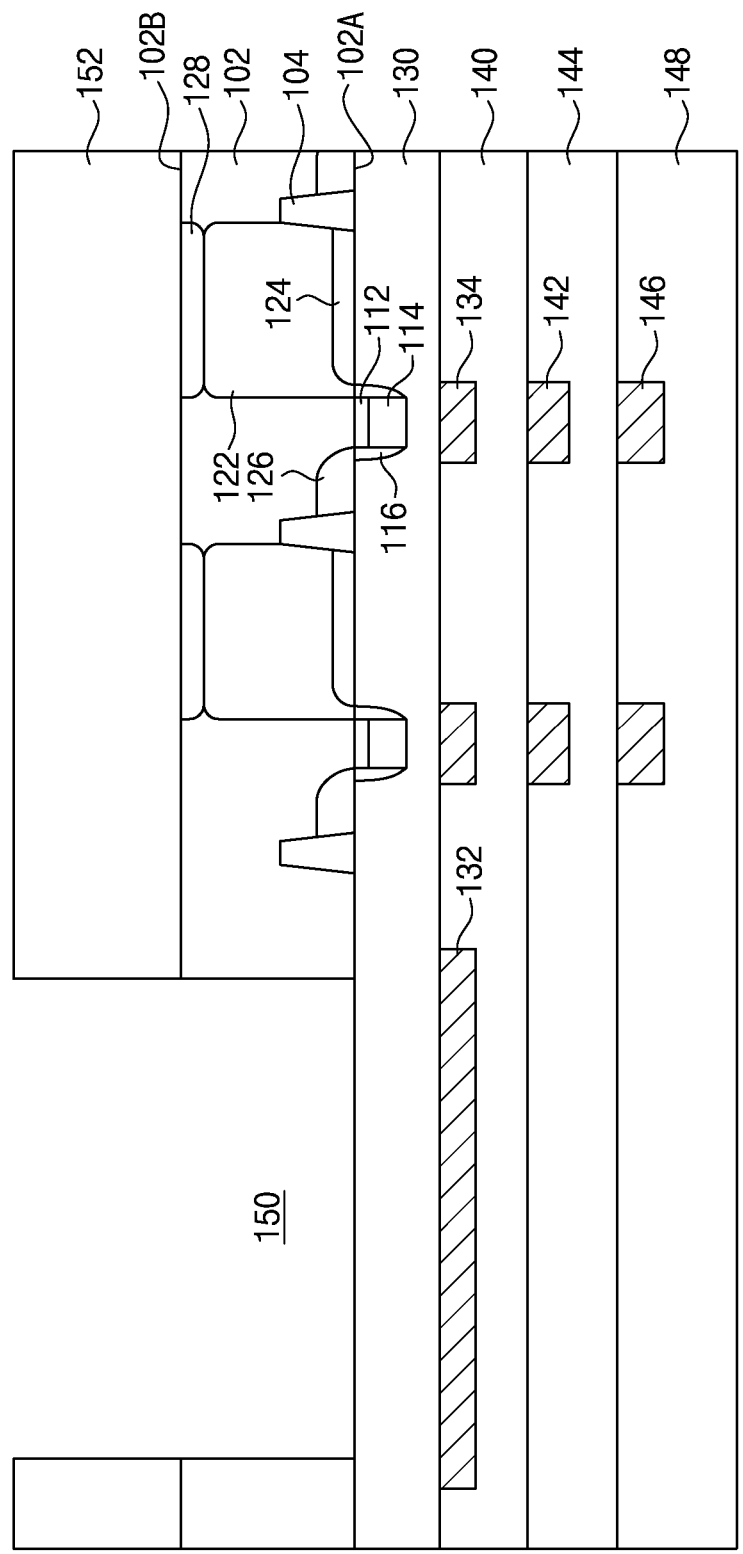

Referring to FIG. 8, the substrate 102 may be partially removed so as to form a first opening 150 partially exposing a backside surface of the insulating layer 130. For example, a first photoresist pattern 152 may be formed on the backside surface 102B of the substrate 102, which exposes a portion of the backside surface 102B of the substrate 102 corresponding to the bonding pad 132. The first opening 150 may be formed by an anisotropic etching process using the first photoresist pattern 152 as an etching mask. The first photoresist pattern 152 may be removed by an ashing or stripping process after forming the first opening 150.

Figure 9:
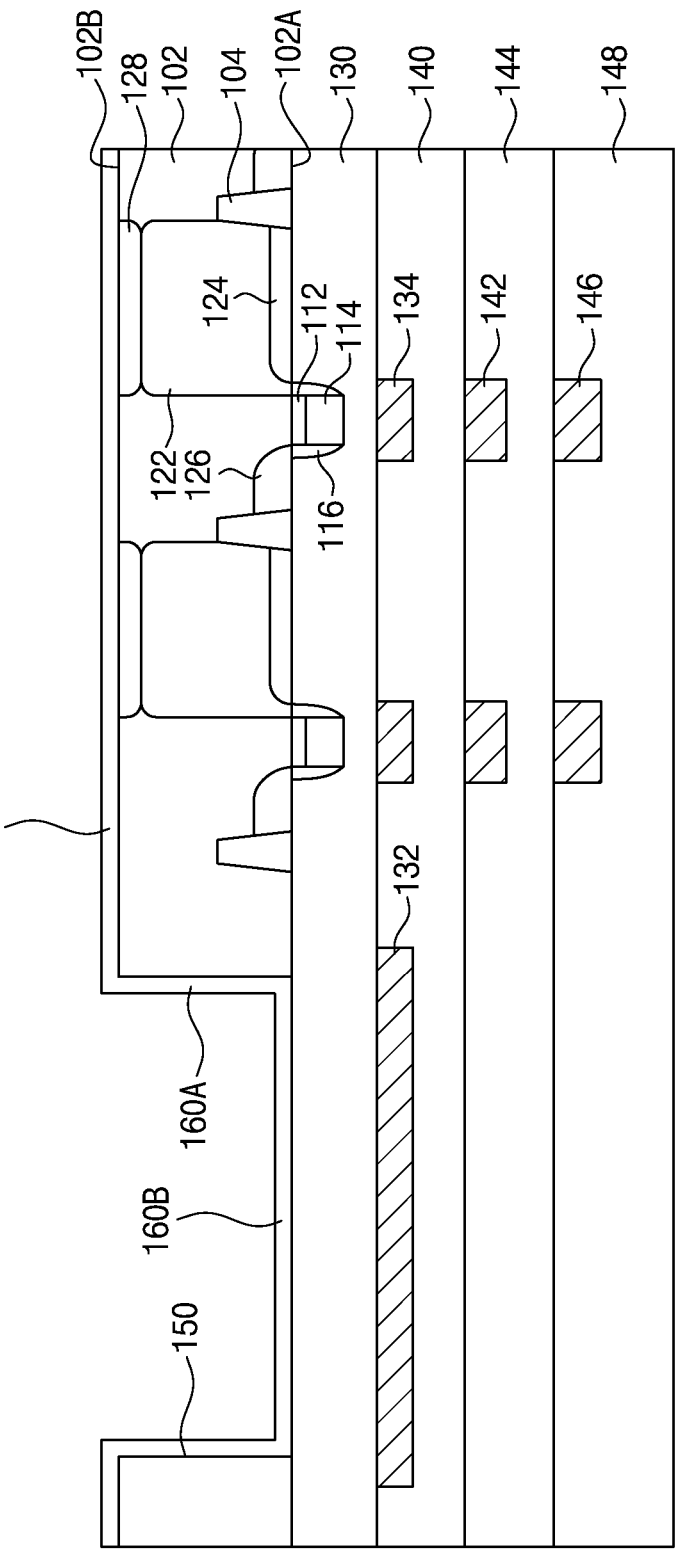

Referring to FIG. 9, an anti-reflective layer 160 may be formed on the backside surface 102B of the substrate 102, an inner side surface of the first opening 150, and a portion of the backside surface of the insulating layer 130 exposed by the first opening 150. Accordingly, the anti-reflective layer 160 may include a first portion 160A formed on the inner side surface of the first opening 150 and a second portion 160B formed on the portion of the backside surface of the insulating layer 130 exposed by the first opening 130. For example, a metal oxide layer 162, a silicon oxide layer 164 and a silicon nitride layer 166 may be sequentially formed on the backside surface 102B of the substrate 102, the inner side surface of the first opening 150, and the portion of the backside surface of the insulating layer 130 exposed by the first opening 150. The metal oxide layer 162 may be formed by a metal organic chemical vapor deposition (MOCVD) process or an atomic layer deposition (ALD) process, and the silicon oxide layer 164 and the silicon nitride layer 166 may be formed by a chemical vapor deposition (CVD) process.

Figure 10:
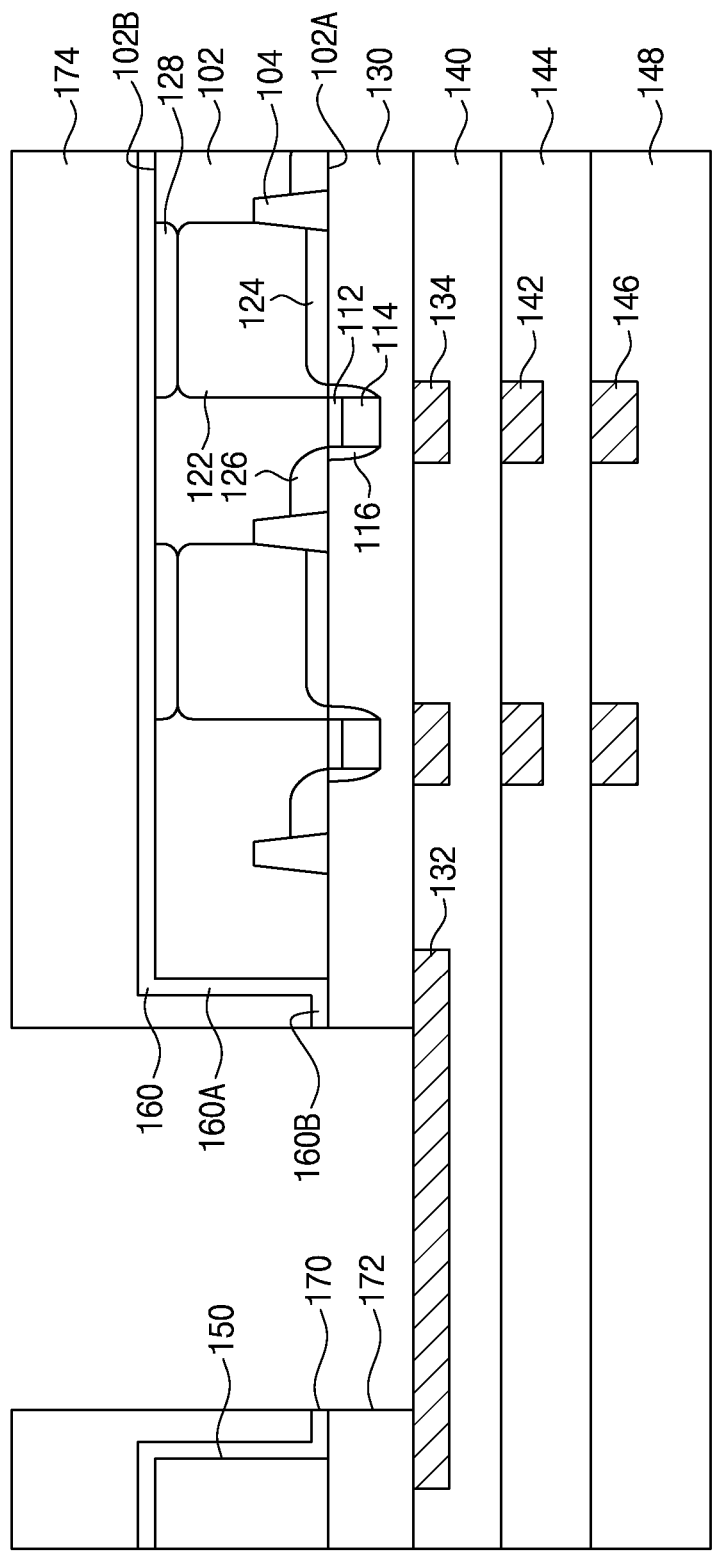

Referring to FIG. 10, the anti-reflective layer 160 and the insulating layer 130 may be partially removed so as to form a second opening 170 and a third opening 172 through which partially expose a backside surface of the bonding pad 132. For example, a second photoresist pattern 174 may be formed on the anti-reflective layer 160, which partially exposes a second portion 160B of the anti-reflective layer 160. The second opening 170 and the third opening 172 may be formed by an anisotropic etching process using the second photoresist pattern 174 as an etching mask. Particularly, the first opening 150 may have a width wider than that of the second opening 170 so as to prevent the first portion 160A of the anti-reflective layer 160 from being damaged during the anisotropic etching process. The second photoresist pattern 174 may be removed by an ashing or stripping process after forming the second opening 170 and the third opening 172.

Figure 11:
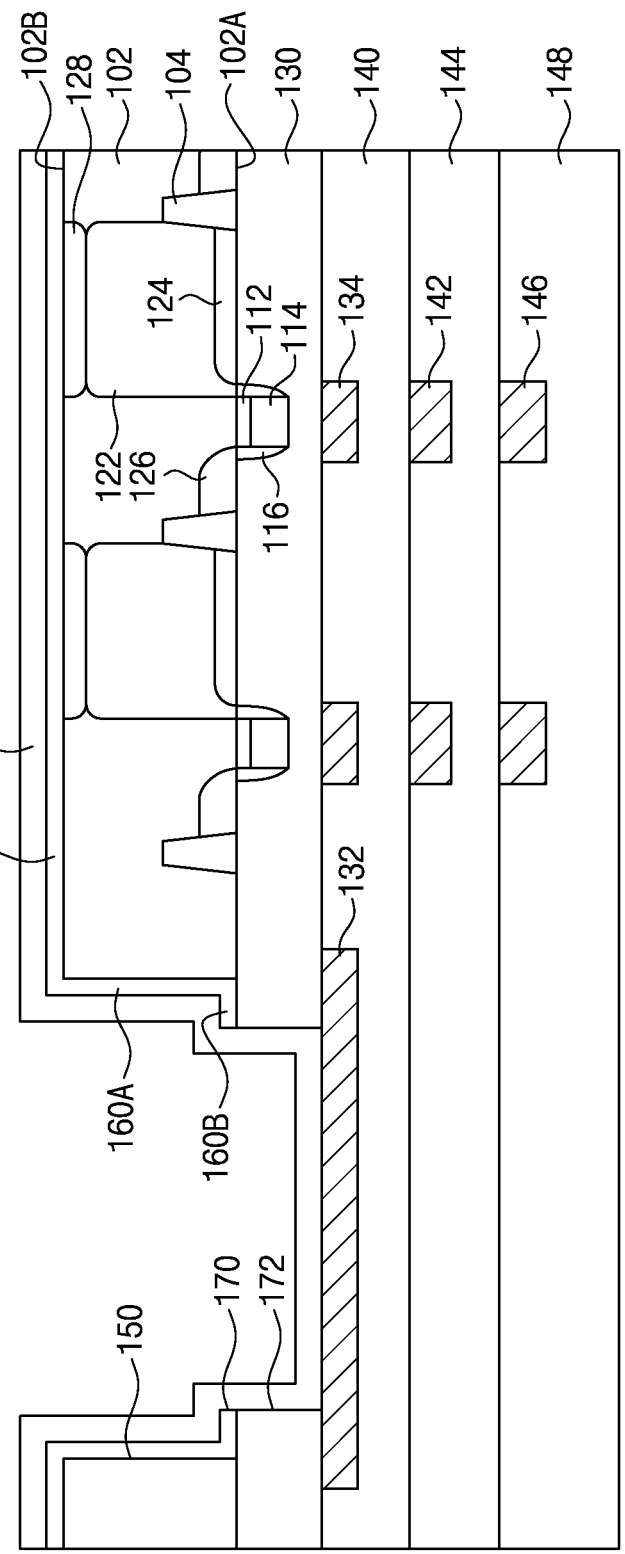

Referring to FIG. 11, a spacer layer 176 may be formed to have a uniform thickness on the anti-reflective layer 160, inner side surfaces of the second and third openings 170 and 172, and a portion of the backside surface of the bonding pad 132 exposed by the third opening 172. For example, the spacer layer 176 may include silicon oxide and may be formed by a CVD process.

Figure 12:
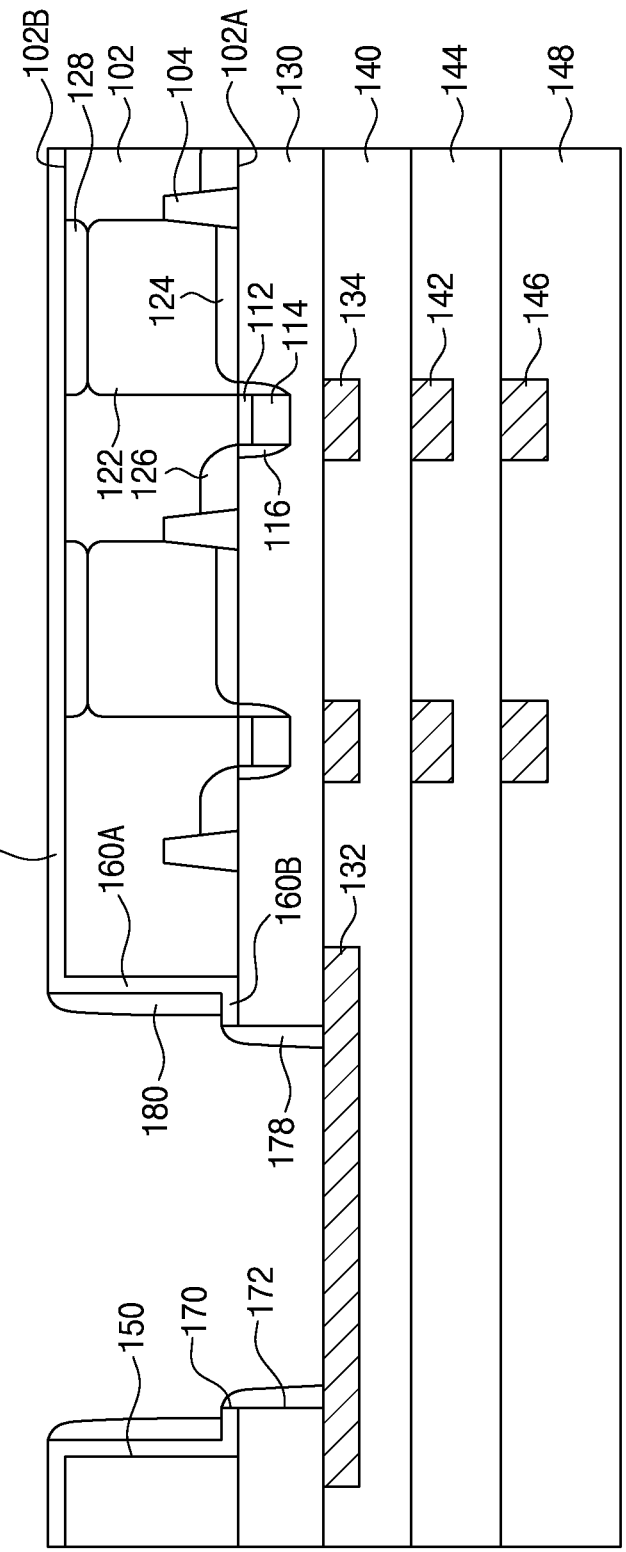

Referring to FIG. 12, the spacer layer 176 may be partially removed to form a first spacer 178 and a second spacer 180. The first spacer 178 may be formed on the inner side surfaces of the second and third openings 170 and 172, and the second spacer 180 may be formed on the first portion 160A of the anti-reflective layer 160. For example, the spacer layer 176 may be partially removed by an anisotropic etching process.

Figure 13:
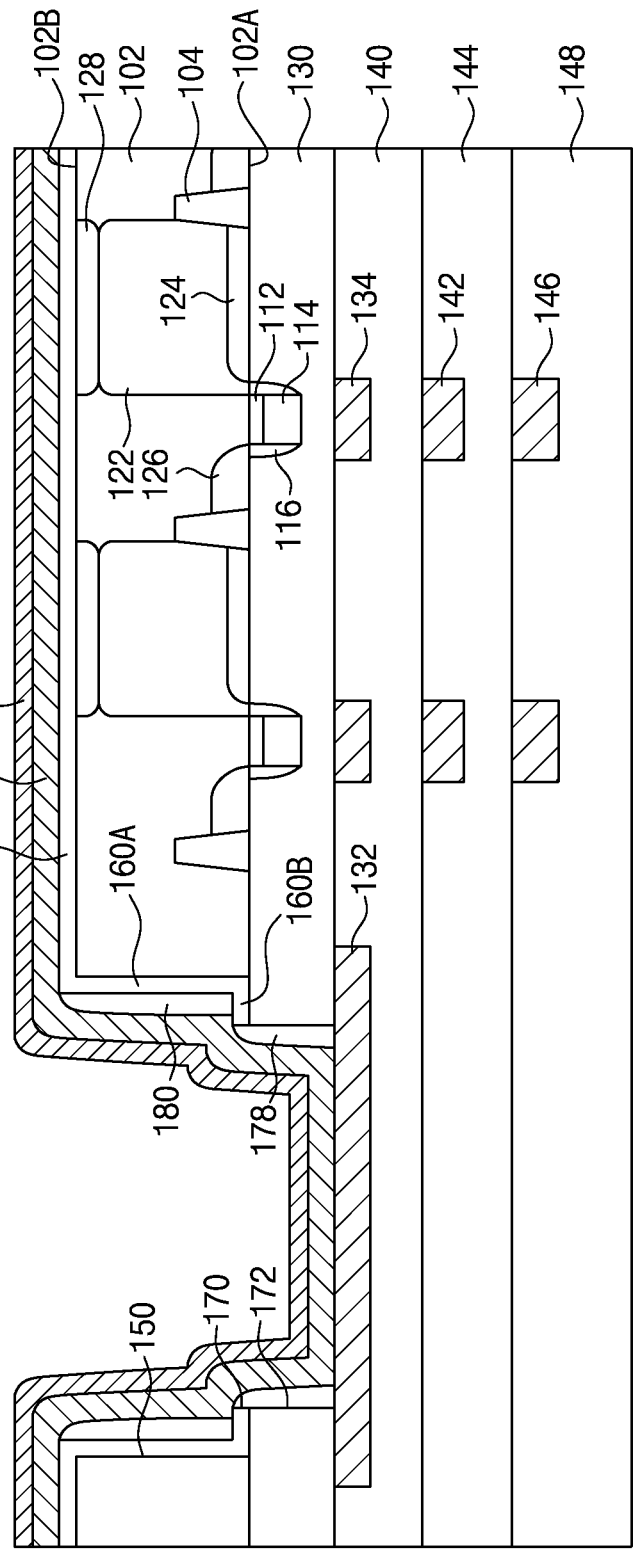
Figure 14:
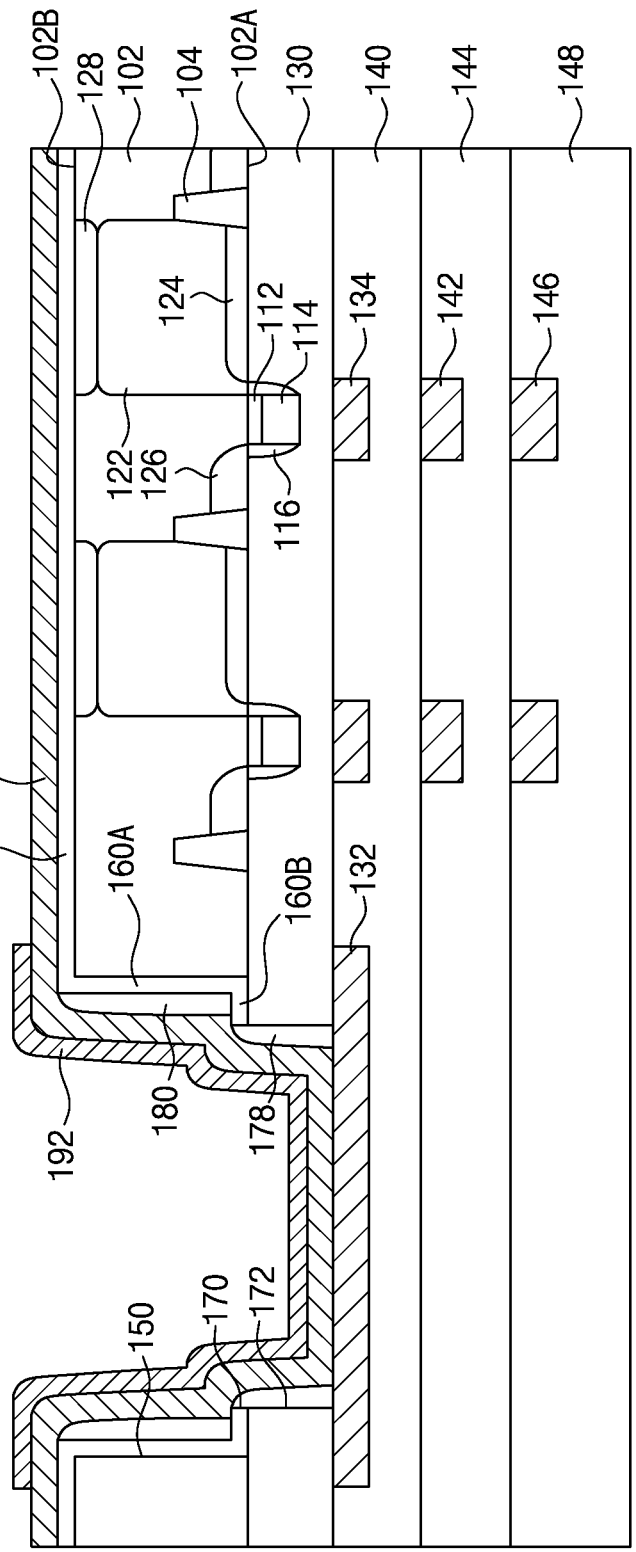
Figure 15:
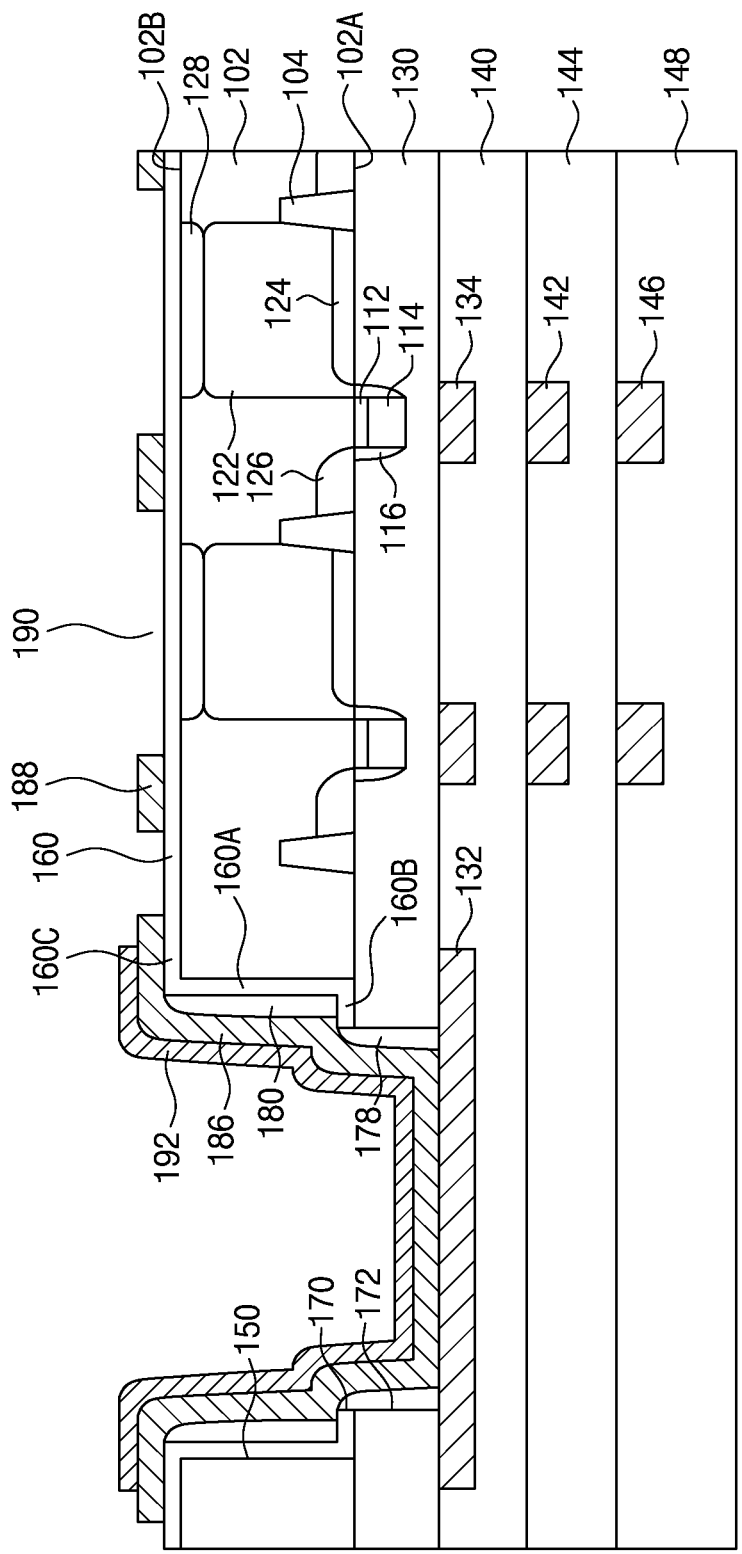

Referring to FIGS. 13 to 15, a second bonding pad 186 may be formed on a third portion 160C of the anti-reflective layer 160, the first and second spacers 178 and 180, and the portion of the backside surface of the bonding pad 132 exposed by the third opening 172. Further, a third binding pad 192 may be formed on the second bonding pad 186, and a light-blocking pattern 188 having fourth openings 190 corresponding to the pixel regions 120 may be formed on the anti-reflective layer 160.

For example, as shown in FIG. 13, a first metal layer 182, e.g., a tungsten layer, may be formed on the anti-reflective layer 160, the first and second spacers 178 and 180, and the portion of the backside surface of the bonding pad 132 exposed by the third opening 172, and a second metal layer 184, e.g., an aluminum layer, may be formed on the first metal layer 182. The third bonding pad 192 may be formed by patterning the second metal layer 184 as shown in FIG. 14, and the second bonding pad 186 and the light-blocking pattern 188 may be formed by patterning the first metal layer 182 as shown in FIG. 15.

Referring again to FIG. 1, a planarization layer 194 may be formed on the anti-reflective layer 160 and the light-blocking pattern 188, and a color filter layer 196 and a micro lens array 198 may be sequentially formed on the planarization layer 194. The planarization layer 194 may be made of an insulating material such as silicon oxide or photoresist material.

In accordance with the embodiments of the present disclosure as described above, the first portion 160A of the anti-reflective layer 160 formed on the inner side surface of the first opening 150 may function as a protective layer for protecting the substrate 102 and an insulating layer for electrically insulating the substrate 102 from the bonding pad 132. As a result, since there is no need to form an additional protective layer as in the prior art, the distance between the pixel regions 120 and the micro lens array 198 may be reduced, so that the sensitivity and crosstalk characteristics of the backside illuminated image sensor 100 may be significantly improved compared to conventional designs.

Further, the anti-reflective layer 160 may include the metal oxide layer 162 disposed on the backside surface 102B of the substrate 102, the silicon oxide layer 164 disposed on the metal oxide layer 162, and the silicon nitride layer 166 disposed on the silicon oxide layer 164, and the first spacer 178 may be used to electrically isolate the metal oxide layer 162 from the bonding pad 132. As a result, the electrical characteristics of the backside illuminated image sensor 100 may be improved compared to conventional designs.

Although the backside illuminated image sensor and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A backside illuminated image sensor comprising:
a plurality of pixel regions disposed in a substrate;
an insulating layer disposed on a frontside surface of the substrate;
a bonding pad disposed on a frontside surface of the insulating layer; and
an anti-reflective layer disposed on a backside surface of the substrate, wherein:
the substrate defines a first opening that at least partially exposes a backside surface of the insulating layer,
the insulating layer defines a third opening that at least partially exposes a backside surface of the bonding pad, the third opening defining an inner side surface thereof,
the anti-reflective layer comprises a first portion disposed on an inner side surface of the first opening and a second portion disposed on a portion of the backside surface of the insulating layer exposed by the first opening and defining a second opening arranged between the first opening and the third opening, the second opening defining an inner side surface thereof, and
a first spacer is disposed on the inner side surfaces of the second opening and the third opening.

2. The backside illuminated image sensor of claim 1, wherein a second spacer is disposed on the first portion of the anti-reflective layer.

3. The backside illuminated image sensor of claim 2, wherein the second opening has the same width as the third opening such that the inner side surfaces thereof are adjacent, and
the first spacer is made of the same material as the second spacer.

4. The backside illuminated image sensor of claim 1, further comprising a second bonding pad disposed on a portion of the backside surface of the bonding pad exposed by the third opening.

5. The backside illuminated image sensor of claim 4, further comprising a light-blocking pattern disposed on the anti-reflective layer and defining a plurality of fourth openings, each one of the plurality of fourth openings corresponding to one of the plurality of pixel regions.

6. The backside illuminated image sensor of claim 5, wherein the second bonding pad is made of the same material as the light-blocking pattern.

7. The backside illuminated image sensor of claim 4, further comprising a third bonding pad disposed on the second bonding pad.

8. The backside illuminated image sensor of claim 1, wherein the anti-reflective layer comprises:
a metal oxide layer disposed on the backside surface of the substrate;
a silicon oxide layer disposed on the metal oxide layer; and
a silicon nitride layer disposed on the silicon oxide layer.

9. The backside illuminated image sensor of claim 1, wherein each one of the plurality of pixel regions comprises:
a charge accumulation region disposed in the substrate; and
a frontside pinning layer disposed between the frontside surface of the substrate and the charge accumulation region.

10. The backside illuminated image sensor of claim 9, wherein the each one of the plurality of pixel regions further comprises a backside pinning layer disposed between the backside surface of the substrate and the charge accumulation region.

11. A method of manufacturing a backside illuminated image sensor, the method comprising:
forming a plurality of pixel regions in a substrate;
forming an insulating layer on a frontside surface of the substrate;
forming a bonding pad on a frontside surface of the insulating layer;
at least partially removing the substrate to form a first opening exposing a portion of a backside surface of the insulating layer;
forming an anti-reflective layer on a backside surface of the substrate, an inner side surface of the first opening and the portion of the backside surface of the insulating layer exposed by the first opening;
at least partially removing the anti-reflective layer and the insulating layer to form a second opening and a third opening, respectively, wherein the second opening and the third opening in combination expose a portion of a backside surface of the bonding pad, and wherein each of the second opening and the third opening defines a respective inner side surface; and
forming a first spacer on the inner side surfaces of the second opening and the third opening.

12. The method of claim 11, further comprising forming a second spacer on a portion of the anti-reflective layer formed on the inner side surface of the first opening.

13. The method of claim 12, wherein the first spacer is made of the same material as the second spacer.

14. The method of claim 12, further comprising:
forming a first metal layer on the anti-reflective layer, the first and second spacers, and the portion of the backside surface of the bonding pad exposed by the third opening;
forming a second metal layer on the first metal layer;
patterning the second metal layer to form a third bonding pad; and
patterning the first metal layer to from a second bonding pad between the bonding pad and the third bonding pad.

15. The method of claim 11, further comprising forming a second bonding pad on the portion of the backside surface of the bonding pad exposed by the third opening.

16. The method of claim 15, further comprising forming a light-blocking pattern having fourth openings corresponding to each one of the plurality of pixel regions on the anti-reflective layer.

17. The method of claim 16, wherein the second bonding pad is made of the same material as the light-blocking pattern and is simultaneously formed with the light-blocking pattern.

18. The method of claim 11, wherein forming the anti-reflective layer comprises:
   forming a metal oxide layer on the backside surface of the substrate, the inner side surface of the first opening and the portion of the backside surface of the insulating layer exposed by the first opening;
   forming a silicon oxide layer on the metal oxide layer; and
   forming a silicon nitride layer of the silicon oxide layer.

19. The method of claim 11, wherein forming each one of the plurality of pixel regions comprises:
   forming charge accumulation regions in the substrate; and
   forming frontside pinning layers between the frontside surface of the substrate and the charge accumulation regions.

20. The method of claim 19, wherein forming each one of the plurality of pixel regions further comprises forming backside pinning layers between the backside surface of the substrate and the charge accumulation regions.

* * * * *